Figure 1:
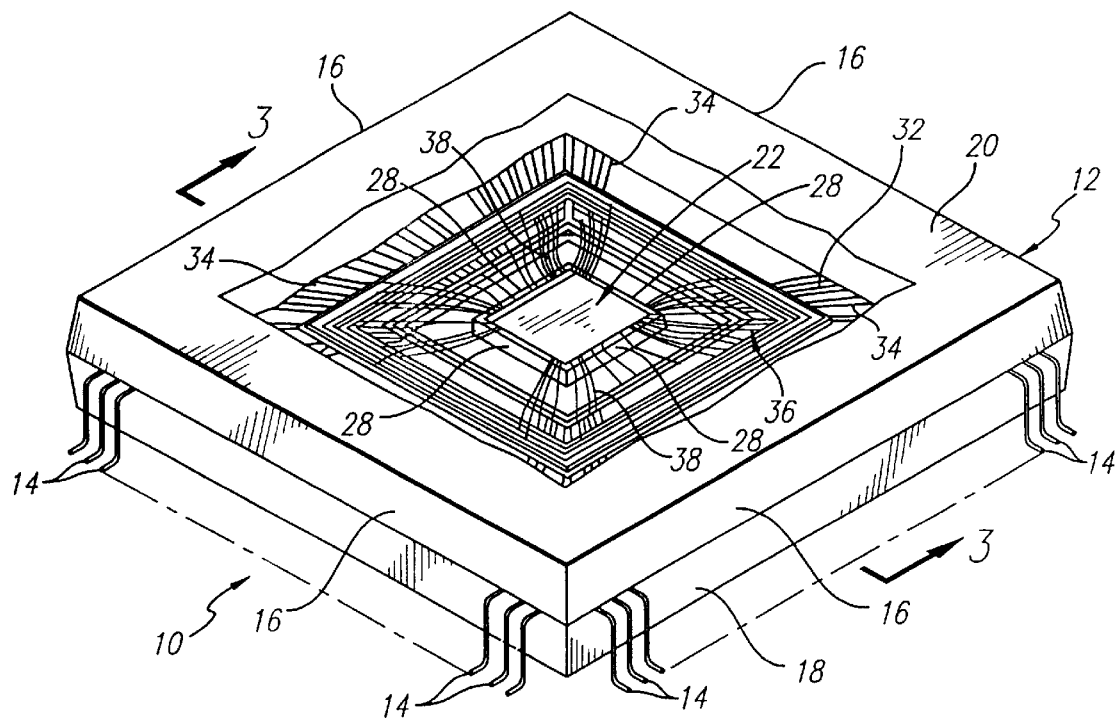

United States Patent
Chia

[19]

[11] Patent Number: 6,114,749
[45] Date of Patent: Sep. 5, 2000

[54] INTEGRATED CIRCUIT WITH LEAD FRAME PACKAGE HAVING INTERNAL POWER AND GROUND BUSSES

[75] Inventor: Chok J. Chia, Campbell, Calif.

[73] Assignee: LSI Loigc Corporation, Milpitas, Calif.

[21] Appl. No.: 08/884,241

[22] Filed: Jun. 27, 1997

Related U.S. Application Data

[62] Division of application No. 08/773,873, Dec. 27, 1996, which is a continuation of application No. 08/616,968, Mar. 18, 1996, abandoned, which is a continuation of application No. 08/354,261, Dec. 12, 1994, abandoned, which is a continuation of application No. 08/056,337, Apr. 30, 1993, abandoned.

[51] Int. Cl.⁷ .................................................. H01L 23/495
[52] U.S. Cl. ........................... 257/666; 257/668; 257/691
[58] Field of Search ..................... 259/666, 676, 259/691, 700, 698, 668, 787

[56] References Cited

U.S. PATENT DOCUMENTS

| | | |
|---|---|---|
| 3,881,175 | 4/1975 | Wanlass . |
| 3,909,838 | 9/1975 | Beyerlein . |
| 4,513,355 | 4/1985 | Schroeder et al. . |
| 4,587,548 | 5/1986 | Grabbe et al. . |
| 4,608,592 | 8/1986 | Miyamoto . |
| 4,890,153 | 12/1989 | Wu .......................................... 257/668 |
| 4,903,114 | 2/1990 | Aoki et al. . |
| 4,987,473 | 1/1991 | Johnson . |
| 5,025,114 | 6/1991 | Braden . |
| 5,027,191 | 6/1991 | Bourdelaise et al. .................... 257/668 |
| 5,036,163 | 7/1991 | Spielberger et al. . |
| 5,096,852 | 3/1992 | Hobson . |
| 5,138,430 | 8/1992 | Gow, III et al. . |
| 5,168,368 | 12/1992 | Gow, III et al. . |
| 5,218,224 | 6/1993 | Farnworth . |
| 5,229,639 | 7/1993 | Hansen et al. . |
| 5,258,575 | 11/1993 | Beppu et al. . |
| 5,311,058 | 5/1994 | Smolley . |
| 5,498,901 | 3/1996 | Chillara et al. ......................... 257/666 |
| 5,777,265 | 7/1998 | Bhattachacharyya .................... 257/787 |
| 5,818,102 | 10/1998 | Rostoker . |

FOREIGN PATENT DOCUMENTS

| | | |
|---|---|---|
| 60-22327 | 2/1985 | Japan . |
| 62-216240 | 9/1987 | Japan . |
| 63-253635 | 10/1988 | Japan . |
| 63-299370 | 12/1988 | Japan . |

*Primary Examiner*—Sheila V. Clark

[57] ABSTRACT

An integrated circuit includes a semiconductor integrated circuit chip housed in a package providing external electrical connections for the circuit chip. The package has only a limited number of external connections available for such use. The package includes an internal buss, or plurality of busses, which are electrically connected to the circuit chip and to selected external connections of the package to improve the efficiency of utilization of external connections on the package, as well as improving operating characteristics of the integrated circuit chip by improvements to voltage and current distributions to the chip, and also eliminating in some cases the consequences of a poor quality of external electrical connection to the package itself.

36 Claims, 2 Drawing Sheets

INTEGRATED CIRCUIT WITH LEAD FRAME PACKAGE HAVING INTERNAL POWER AND GROUND BUSSES

CROSS-REFERENCE TO RELATED APPLICATIONS

This is a divisional of application Ser. No. 08/773,873, filed Dec. 27, 1996, which is a continuation of Ser. No. 08/616,968, filed Mar. 18, 1996, now abandoned, which is a continuation of Ser. No. 08/354,261, filed Dec. 12, 1994, now abandoned, which is a continuation of Ser. No. 08/056,337, filed Apr. 30, 1993, now abandoned.

BACKGROUND OF THE INVENTION

1. Field of the Invention

The present invention relates generally to integrated circuits. More particularly, the present invention relates to an integrated circuit having a lead frame package with internal busses for power distribution and grounding.

2. Discussion of the Related Technology

Integrated circuits are generally mounted in lead frame packages which provide both environmental protection to the semiconductor chip on which the small-scale portion of the integrated circuit is formed, as well as providing for electrical connection of the integrated circuit chip to external circuitry. With large scale integrated circuits having the necessity for a multitude of external electrical connections, the physical limitations of the lead frame package limits the performance of the integrated circuit which may be housed within a particular size of package. This packaging limitation also significantly increases the cost of the integrated circuit by necessitating an increase in the size of the integrated circuit chip itself beyond that which would otherwise be required. This size increase of the integrated circuit chip is necessary simply to allow for the limitations of the packaging technology. In the pertinent art, this limitation imposed by the chip packaging is referred to as an I/O (input/output) limitation on chip performance.

To further elaborate, the lead frame package generally includes a base which is square in plan view and which carries a lead frame. At the periphery of the base this lead frame provides depending legs each forming a separate electrical contact for the integrated circuit. A typical lead frame package might include fifty-two contact legs along each side edge of the package for a total of 208 contacts. The lead frame also includes a plurality of lead fingers each extending from a respective contact leg radially inwardly across the base toward the integrated circuit semiconductor chip. Because the semiconductor circuit chip is small in size compared with the size of the package, the lead fingers taper to become narrower in width and also to become closer together as they approach the integrated circuit chip. In plan view this plurality of lead frame fingers appears like a star burst surrounding the integrated circuit chip.

Such lead frames are generally stamped or chemically etched from sheet material for convenience and economy of manufacture. With a standard lead finger thickness of 0.15 mm, present technology in the production of the lead frames limits the lead finger pitch (center-to-center dimension of the lead fingers) to 0.2 mm. A similar limitation applies to the minimum width of each lead frame finger. Consequently, with each certain number of lead frame contacts and lead frame fingers, there is a technology-limited minimum size of the area bounded by the inner ends of the lead frame fingers and within which the integrated chip itself can be mounted.

Further, the contact pads of the semiconductor integrated circuit chip are generally connected to the inner ends of the lead frame fingers using fine-dimension wire bond conductors. The length of these wire bond conductors are themselves technology limited to a maximum of about 4.5 mm. Consequently, there results a minimum size for the semiconductor chip dependent on the number of contact pads thereon. If the semiconductor chip is made smaller than this minimum size it cannot be connected to external circuitry because of the limitations of the lead frame and wire bond technologies. That is, the lead frame fingers and wire bond conductors cannot reach the small integrated circuit with the large number of such fingers and wire bond conductors required.

As is easily understood, the necessity of making a semiconductor chip larger than would otherwise be required has great cost disadvantages both in terms of material and facilities utilizations. Particularly, an integrated circuit chip which is physically larger than required decreases the number of chips which may be formed on each semiconductor wafer, and decreases the yield of chips from each wafer which is processed through the manufacturing facilities.

Still further, a typical integrated circuit chip may have as many as twenty percent, or more, of its contact pads devoted just to the supplying of power and ground connections to the integrated circuit. Because conventional practice uses one of the lead frame fingers for each one of the contact pads of the integrated circuit chip, a considerable part of the electrical connection capacity of the package is devoted to simply providing power and ground connections to the integrated circuit.

SUMMARY OF THE INVENTION

In view of the above, an object of this invention is to provide an integrated circuit housed in a lead frame package and with an improved number of contact pads for the integrated circuit which are connected externally via the lead frame package.

An other object for the present invention is to improve the performance and usefulness of the lead frame package with a view to the number of integrated circuit contact pads which can be connected with a particular size of lead frame package.

Additionally, an objective for the present invention is to provide a lead frame package with an internal buss structure adjacent to the integrated circuit chip.

Still another objective of the present invention is to provide a lead frame package of the above-described character wherein the internal buss structure is particularly adapted to provide power distribution and grounding within the lead frame package adjacent to the integrated circuit chip.

Accordingly, the present invention provides an integrated circuit with a lead frame package having a base upon which is mounted an integrated circuit chip with plural contact pads electrically connecting with respective peripheral contacts of the base, a lead frame extending radially across the base and outwardly connecting with the contacts of the base while inwardly connecting with the contact pads of the integrated circuit chip, the lead frame including plural spaced apart conductive lead frame fingers tapering radially inwardly between the contacts of the base and the contact pads of the integrated circuit chip, and the lead frame fingers cooperatively carrying a peripheral conductive buss adjacent to and circumscribing the integrated circuit chip.

DESCRIPTION OF THE DRAWING FIGURES

Figure 3:
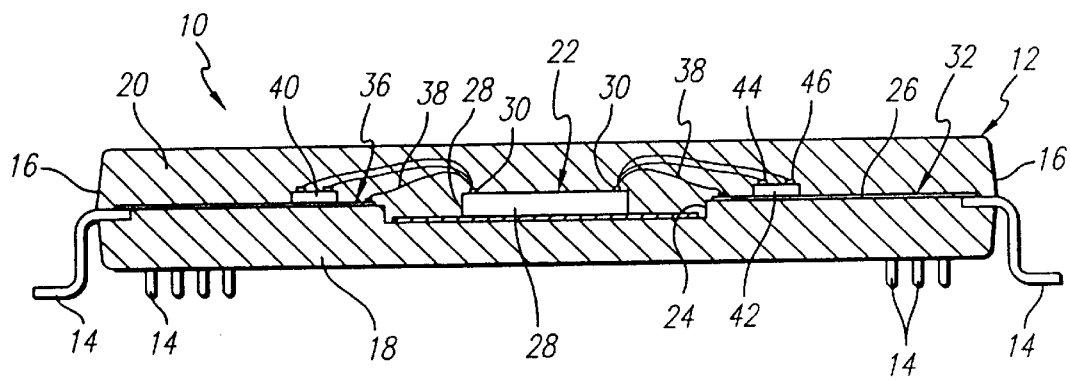
Figure 2:
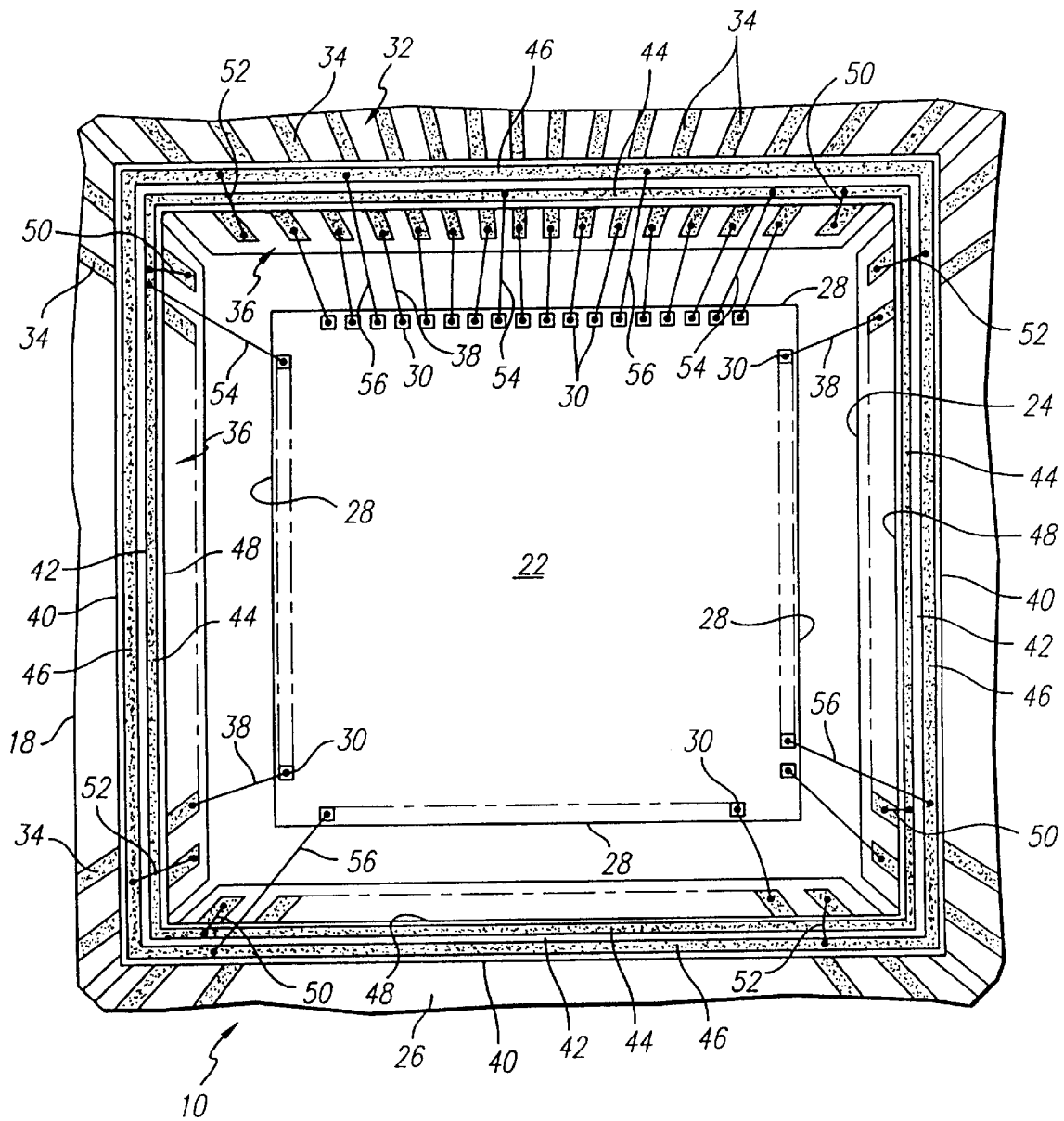

FIG. 1 provides a perspective view of an integrated circuit which includes an integrated circuit chip and a quad package, the package being partially broken away to better illustrate internal structure of the integrated circuit and its package;

FIG. 2 provides an enlarged plan view of the internal structure of the quad package in the vicinity of the integrated circuit chip, and also with parts of the package broken away to better illustrate details of the structure; and FIG. 3 shows a fragmentary cross sectional view taken along a line 3—3 of FIG. 2.

DESCRIPTION OF THE EXEMPLARY PREFERRED EMBODIMENT

FIG. 1 perspectively illustrates an integrated circuit 10 which includes a comparatively thin square package 12, which is generally referred to as a "quad package", because it includes electrical contact legs 14 extending from all four edges 16 of the package 12. By way of example only and without limitation, the package 12 may include 52 contact legs at each edge 16 so that a total of 208 contacts are available for external electrical connections with the integrated circuit 10. This package 12 includes a base portion 18 from which the contacts 14 depend, and a cover or top portion 20 overlying the base portion 18 as well as an integrated circuit chip 22 mounted thereon. In FIG. 1, a central part of the top portion 20 has been broken away to better depict the integrated circuit chip 22 as well as other structure of the package 12 adjacent to the chip.

As mentioned, generally in the center of the base portion 18 the integrated circuit chip 22 is secured (best seen by viewing FIG. 2). This integrated circuit is comparatively small, generally on the order of one-forth of an inch on each side, and is also square in plan view and comparatively thin. The package 12 will generally be about an inch on each side so that there is a considerable difference between the size of the package 12 and the circuit chip 22. The circuit chip 18 is mounted in a shallow recess 24, so-that the chip is surrounded by a plateau 26 (seen in FIG. 3) extending outwardly toward the edges 16 of the base portion 18 where the contact legs 14 are disposed. Adjacent to side edges 28 of the circuit chip 22 the latter includes a plurality of contact pads 30. For ease of illustration in the drawing Figures, the number of contact pads 30 and of contact legs 14 has been considerably reduced. However, the structure depicted is representative of the actual physical structure of an integrated circuit chip and its package.

In order to electrically connect the contact pads 30 of the circuit chip 22 with respective ones of the contact legs 14 on the base 18, the latter carries a lead frame 32 extending across the plateau 26. The lead frame 32 includes a plurality of spaced-apart and fanned-out tapering conductive lead fingers 34 which are equal in number with and connect at their outer ends (not shown) to the contact legs 14. As the lead fingers extend from the contact legs 14 inwardly across the plateau 26; they necessarily taper to become narrower and also to become closer together. FIG. 2 depicts only the inner end portions 36 of the lead fingers 34. These lead fingers 34 extend toward but end short of the contact pads 30 of the circuit chip 22.

During manufacture of the integrated circuit l0, the circuit chip 22 and lead frame 32 are each secured to the base portion 18 of the package 12, and plural fine-dimension wire bond conductors 38 are secured at their inner ends to respective contact pads 30 of the circuit chip 22. These fine-dimension wire bond conductors are also secured at their outer ends to respective inner end portions 36 of the lead fingers 34 in order to complete the electrical connections between the contact legs 14 and the contact pads 30.

In order to protect and maintain the relative positions of the lead fingers 34 of the lead frame 32, an open-centered square 40 of insulative polymer film material is adhesively secured to the lead fingers immediately outside of the inner end portions 36 thereof. Preferably, this open-centered square 40 may be made of Kapton material, and may be provided with a pressure-sensitive, contact, temperature curing, or catalyzed adhesive to secure it to the lead fingers 34. This open-centered square 40 of film material circumscribes the circuit chip 22, and assists in locating the inner end portions 36 of the lead fingers during manufacturing operations, including placement of the wire bond conductors 38.

Importantly, this open-centered square 40 of film material also carries on an upper surface 42 thereof, away from the underlying lead fingers 34, a pair of spaced-apart circumferential bus conductors 44 and 46. These bus conductors are disposed adjacent to an inner edge 48 of the square 40 and immediately outwardly of the inner portions 36 of the lead fingers. By way of example, the buss conductors 44, 46 may be formed on the upper surface 42 of the film material by plating or printing. However, the buss conductors 44 and 46 are connected to respective ones of the lead fingers 34 which according to the exemplary embodiment carry respective power and ground connections to the chip 28 from external circuitry.

As is illustrated in FIG. 2, the power buss 44 is connected by a wire bond conductor 50 in each of the four quadrants thereof to one of the lead fingers 34 in the same quadrant of the package 12 which carries power to the chip 22. This arrangement of conductors ensures a desirable distribution of voltage drops and current flows in the power buss 44. Similarly, the ground buss 46 is connected to the grounded lead fingers by wire bond conductors 52. Particular contact pads of the integrated circuit chip 22 which require that either power or ground connection be supplied thereto are connected to the power buss 44 or to the ground buss 46 by respective wire bond conductors 54 and 56, rather than to an individual lead finger 34. Thus, the number of lead fingers which are required for the conducting of power to the chip 22 can be reduced to four, for example. If desired, the number of lead fingers carrying power to the chip 22 could even be reduced to one. Similarly, the grounding connection to the chip 22 can also be reduced to a single lead finger, if desired.

As set out above, a conventional integrated circuit generally requires a considerable number of power and ground connections to the integrated circuit chip thereof. Conventionally, these power and ground connections may preempt as much as twenty percent or more of the lead fingers. For example, with a lead frame package of 208 contacts, as many as forty-two, or more of the lead fingers may be conventionally used to supply power and ground connections to the integrated circuit. These power and ground connections will generally be distributed around the perimeter of the integrated circuit. Thus, only 166, or fewer, of the lead fingers are available to connect other functions to the integrated circuit chip.

However, with the same package of 208 contacts, the present invention allows as many as 206 of the lead frame fingers to be used for the functions other than power supply and grounding, an improvement in packaging utilization of over twenty-four percent. Even if the internal power and grounding busses are each provided with two lead frame finger connections in each quadrant, as might be desirable in order to achieve voltage drop and current distribution objectives in the busses, for a total of eight lead frame fingers so utilized, the improvement over the conventional example of using only 166 of the fingers for other functions is better than twenty percent.

Another advantageous consideration with the present invention is that the operational characteristics of the integrated circuit chip itself may be improved by the package having power and ground busses therein. That is, the voltage distribution uniformity or current availability to various ones of the contact pads of the integrated circuit chip may be improved by the present invention. The ground and power busses 44 and 46 each immediately circumscribe the integrated circuit chip 22, and the contact pads 30 thereof. Consequently, the voltage level uniformity and current availability to the contact pads of the circuit chip should be improved by the present invention, with a commensurate improvement in the operation of the circuit chip. Also, the consequences of a less-than-perfect power or ground connection between one of the contact legs 14 and the board (not shown) upon which the integrated circuit 10 is mounted should be decreased by the present invention. With a conventional integrated circuit, such a weak connection can seriously decrease the operational ability of a portion of the circuit chip. However, with the present invention, so long as the other power and ground connections are adequate, operation of the circuit chip should not be affected.

While the present invention has been depicted, described, and is defined by reference to a particularly preferred embodiment of the invention, such reference does not imply a limitation on the invention, and no such limitation is to be inferred. The invention is capable of considerable modification, alteration, and equivalents in form and function, as will occur to those ordinarily skilled in the pertinent arts. The depicted and described preferred embodiment of the invention is exemplary only, and is not exhaustive of the scope of the invention. Consequently, the invention is intended to be limited only by the spirit and scope of the appended claims, giving full cognizance to equivalents in all respects.

I claim:

1. An integrated circuit package comprising:

a lead frame package having a base which has peripheral contacts;

a plurality of vertical contact legs extending outwardly from a bottom of said base;

a shallow recess on a top surface of said base;

an integrated circuit chip mounted in said shallow recess, said chip including plural contact pads electrically connecting with respective said peripheral contacts of said base;

a lead frame including plural spaced apart conductive lead frame fingers tapering radially inwardly between and electrically connecting said peripheral contacts of said base and said contact pads of said chip;

a rectangular power bus and rectangular ground bus cooperatively supported on said lead frame fingers and disposed adjacent to and encircling said integrated circuit chip, said ground bus being disposed outside said power bus, and said busses being disposed on a top surface of said base;

a non-conductive film carried by said lead frame fingers and supporting said power bus and said ground bus;

first wire bonds directly connecting said contact pads of said integrated circuit chip to said bus;

second wire bonds directly connecting said bus to said lead frame fingers; and third wire bonds directly connecting said pads of said integrated circuit chip to said lead frame fingers;

wherein said base forms quadrants, said power bus being electrically connected to a selected one and only one of said lead frame fingers in each said quadrant of said base.

2. An integrated circuit comprising:

a lead frame package having a base upon which is mounted an integrated circuit chip with plural contact pads electrically connecting with respective peripheral contacts of the base;

a lead frame extending radially across the base and outwardly connecting with the contacts of the base while inwardly connecting with the contact pads of the integrated circuit chip, the lead frame including plural spaced apart conductive lead frame fingers tapering radially inwardly between and electrically connecting the contacts of the base and the contact pads of the integrated circuit chip; and a conductive buss cooperatively supported on the lead frame fingers and disposed adjacent to the integrated circuit chip;

wherein the buss provides ground connection for the integrated circuit chip.

3. The integrated circuit of claim 2 wherein the lead frame fingers carry a non-conductive film on which the buss is supported.

4. The integrated circuit of claim 3 wherein the buss is plated or printed on the film.

5. The integrated circuit of claim 4 wherein the film is adhesively secured to the lead frame fingers.

6. The integrated circuit of claim 3 wherein the film is Kapton polymer.

7. The integrated circuit of claim 2 wherein the buss is connected to a selected one of the lead frame fingers.

8. The integrated circuit of claim 7 wherein the base forms quadrants, the buss being connected to a selected one of the lead frame fingers in each quadrant of the base.

9. The integrated circuit of claim 2 further including plural fine-dimension conductors extending between and electrically connecting the integrated circuit chip and the buss.

10. The integrated circuit of claim 2 wherein the integrated circuit includes a plurality of busses arranged successively outwardly about the integrated circuit chip.

11. The integrated circuit of claim 2 further including a fine-dimension conductor extending between and electrically connecting the buss to one of the lead frame fingers.

12. An integrated circuit package comprising:

a lead frame package having a base which has peripheral contacts;

an integrated circuit chip mounted on the base and including plural contact pads electrically connecting with the respective peripheral contacts of the base;

a lead frame including plural spaced apart conductive lead frame fingers tapering radially inwardly between and electrically connecting the peripheral contacts of the base and the contact pads of the integrated circuit chip;

a rectangular conductive buss cooperatively supported on the lead frame fingers and disposed adjacent to and encircling the integrated circuit chip;

wire bonds directly connecting the contact pads of the integrated circuit chip to the buss;

additional wire bonds directly connecting the buss to the lead frame fingers; and an additional rectangular buss cooperatively supported on the lead frame fingers and encircling the integrated circuit chip.

13. The integrated circuit of claim 12 further comprising a plurality of vertical contact legs extending outwardly from a bottom of the base.

14. The integrated circuit of claim 12 wherein the peripheral contacts of the base are gull-wing shaped contact legs.

15. The integrated circuit of claim 12 wherein the base includes a shallow recess in which the integrated circuit chip is mounted.

16. The integrated circuit of claim 12 further comprising wire bonds directly connecting the pads of the integrated circuit chip to the lead frame fingers.

17. The integrated circuit of claim 12 further comprising a non-conductive film carried by the lead frame fingers and supporting the buss.

18. The integrated circuit of claim 17 wherein the buss is plated on the film.

19. The integrated circuit of claim 1 wherein the base forms quadrants, the buss being electrically connected to a selected one and only one of the lead frame fingers in each of the quadrants of the base.

20. An integrated circuit package comprising:
a lead frame package having a base which has peripheral contacts;
an integrated circuit chip mounted on the base and including plural contact pads electrically connecting with the respective peripheral contacts of the base;
a lead frame including plural spaced apart conductive lead frame fingers tapering radially inwardly between and electrically connecting the peripheral contacts of the base and the contact pads of the integrated circuit chip;
a rectangular conductive buss cooperatively supported on the lead frame fingers and disposed adjacent to and encircling the integrated circuit chip;
wire bonds directly connecting the contact pads of the integrated circuit chip to the buss;
additional wire bonds directly connecting the buss to the lead frame fingers; and
an additional rectangular buss cooperatively supported on the lead frame fingers and encircling the integrated circuit chip;
wherein the buss being a power buss, and the additional buss being a ground buss.

21. An integrated circuit package comprising:
a lead frame package having a base which has peripheral contacts;
an integrated circuit chip mounted on the base and including plural contact pads electrically connecting with the respective peripheral contacts of the base;
a lead frame including plural spaced apart conductive lead frame fingers tapering radially inwardly between and electrically connecting the peripheral contacts of the base and the contact pads of the integrated circuit chip;
a rectangular conductive buss cooperatively supported on the lead frame fingers and disposed adjacent to and encircling the integrated circuit chip;
wire bonds directly connecting the contact pads of the integrated circuit chip to the buss;
additional wire bonds directly connecting the buss to the lead frame fingers; and
an additional rectangular buss cooperatively supported on the lead frame fingers and encircling the integrated circuit chip;
wherein the buss being a power buss, and the additional buss being a ground buss; and
wherein only four of the additional wire bonds directly connect each quadrant of the power buss to the lead frame fingers.

22. An integrated circuit package comprising:
a lead frame package having a base which has peripheral contacts;
an integrated circuit chip mounted on the base and including plural contact pads electrically connecting with the respective peripheral contacts of the base;
a lead frame including plural spaced apart conductive lead frame fingers tapering radially inwardly between and electrically connecting the peripheral contacts of the base and the contact pads of the integrated circuit chip;
a rectangular conductive buss cooperatively supported on the lead frame fingers and disposed adjacent to and encircling the integrated circuit chip;
wire bonds directly connecting the contact pads of the integrated circuit chip to the buss;
additional wire bonds directly connecting the buss to the lead frame fingers; and
an additional rectangular buss cooperatively supported on the lead frame fingers and encircling the integrated circuit chip;
wherein the buss being a power buss, and the additional buss being a ground buss; and
wherein the ground buss is disposed outside the power buss.

23. An integrated circuit package comprising:
a lead frame package having a base which has peripheral contacts;
an integrated circuit chip mounted on the base and including plural contact pads electrically connecting with the respective peripheral contacts of the base;
a lead frame including plural spaced apart conductive lead frame fingers tapering radially inwardly between and electrically connecting the peripheral contacts of the base and the contact pads of the integrated circuit chip;
a rectangular conductive buss cooperatively supported on the lead frame fingers and disposed adjacent to and encircling the integrated circuit chip;
wire bonds directly connecting the contact pads of the integrated circuit chip to the buss;
additional wire bonds directly connecting the buss to the lead frame fingers; and
an additional rectangular buss cooperatively supported on the lead frame fingers and encircling the integrated circuit chip;
wherein the buss being a power buss, and the additional buss being a ground buss; and
wherein the power buss and the ground buss are disposed on a top surface of the base.

24. An integrated circuit package comprising:
a lead frame package having a base which has peripheral contacts;
an integrated circuit chip mounted on the base and including plural contact pads electrically connecting with the respective peripheral contacts of the base;
a lead frame including plural spaced apart conductive lead frame fingers tapering radially inwardly between and electrically connecting the peripheral contacts of the base and the contact pads of the integrated circuit chip;

a rectangular buss cooperatively supported on the lead frame fingers and disposed adjacent to and encircling the integrated circuit chip, the buss being a continuous circumferential electrical conductor encircling the integrated circuit chip;

wire bonds directly connecting the contact pads of the integrated circuit chip to the buss; and additional wire bonds directly connecting the buss to the lead frame fingers.

25. The integrated circuit package of claim 24 further comprising an additional rectangular buss cooperatively supported on the lead frame fingers and encircling the integrated circuit chip.

26. The integrated circuit package of claim 25 wherein the buss being a power buss, and the additional buss being a ground bus.

27. The integrated circuit package of claim 26 wherein only four of the additional wire bonds directly connect each quadrant of the power buss to the lead frame fingers.

28. The integrated circuit package of claim 26 wherein the ground buss is disposed outside the power buss.

29. The integrated circuit package of claim 26 wherein the power buss and the ground buss are disposed on a top surface of the base.

30. The integrated circuit package of claim 24 further comprising a plurality of vertical contact legs extending outwardly from a bottom of the base.

31. The integrated circuit package of claim 24 wherein the peripheral contacts of the base are gull-wing shaped contact legs.

32. The integrated circuit package of claim 24 wherein the base further includes a shallow recess in which the integrated circuit chip is mounted.

33. The integrated circuit package of claim 24 further comprising wire bonds directly connecting the pads of the integrated circuit chip to the lead frame fingers.

34. The integrated circuit package of claim 24 further comprising a non-conductive film carried by the lead frame fingers and supporting the buss.

35. The integrated circuit package of claim 34 wherein the buss is plated on the film.

36. The integrated circuit package of claim 24 wherein the base forms quadrants, the buss being electrically connected to a selected one and only one of the lead frame fingers in each of the quadrants of the base.

* * * * *